United States Patent
Zhai et al.

(10) Patent No.: US 9,843,263 B2
(45) Date of Patent: *Dec. 12, 2017

(54) SYSTEMS AND METHODS FOR DRIVING A BIPOLAR JUNCTION TRANSISTOR BY ADJUSTING BASE CURRENT WITH TIME

(71) Applicant: ON-BRIGHT ELECTRONICS (SHANGHAI) CO., LTD., Shanghai (CN)

(72) Inventors: Xiangkun Zhai, Shanghai (CN); Yuan Lin, Shanghai (CN); Xiaomin Huang, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 330 days.

This patent is subject to a terminal disclaimer.

(21) Appl. No.: 14/220,032

(22) Filed: Mar. 19, 2014

(65) Prior Publication Data

US 2014/0204627 A1    Jul. 24, 2014

Related U.S. Application Data

(63) Continuation of application No. 13/213,931, filed on Aug. 19, 2011, now Pat. No. 8,723,558.

(30) Foreign Application Priority Data

Jun. 20, 2011    (CN) .......................... 2011 1 0171960

(51) Int. Cl.
*H03K 3/00*    (2006.01)
*H02M 3/335*    (2006.01)
(Continued)

(52) U.S. Cl.
CPC .... *H02M 3/33507* (2013.01); *H03K 17/0414* (2013.01); *H03K 17/0422* (2013.01); *H03K 17/063* (2013.01)

(58) Field of Classification Search
CPC .......... H02M 3/33507; H03K 17/0422; H03K 17/063; H03K 17/0414
See application file for complete search history.

(56) References Cited

U.S. PATENT DOCUMENTS 7,477,532 B2    1/2009  Hall et al.
8,212,495 B2    7/2012  Liess et al.
(Continued)

FOREIGN PATENT DOCUMENTS

| CN | 1917344 A | 2/2007 |
|---|---|---|
| CN | 1988347 A | 6/2007 |
| CN | 102017377 A | 4/2011 |

OTHER PUBLICATIONS

China Patent Office, Office Action dated Aug. 7, 2014, in Application No. 201110171960.0.
(Continued)

*Primary Examiner* — Kenneth B Wells
(74) *Attorney, Agent, or Firm* — Jones Day

(57) ABSTRACT

System and method for driving a bipolar junction transistor for a power converter. The system includes a current generator configured to output a drive current signal to a bipolar junction transistor to adjust a primary current flowing through a primary winding of a power converter. The current generator is further configured to output the drive current signal to turn on the bipolar junction transistor during a first time period, a second time period, and a third time period, the second time period separating the first time period from the third time period, drive the bipolar junction transistor to operate in a hard-saturation region during the first time
(Continued)

period and the second time period, and drive the bipolar junction transistor to operate in a quasi-saturation region during the third time period.

23 Claims, 13 Drawing Sheets

(51) Int. Cl.
    *H03K 17/0414*     (2006.01)
    *H03K 17/0422*     (2006.01)
    *H03K 17/06*     (2006.01)

(56) References Cited

U.S. PATENT DOCUMENTS

| | | |
|---|---|---|
| 8,411,468 B2 | 4/2013 | Lalithambika et al. |
| 8,723,558 B2 * | 5/2014 | Zhai .................. H03K 17/0414 327/108 |
| 2010/0091525 A1 | 4/2010 | Lalithambika et al. |

OTHER PUBLICATIONS

China Patent Office, Office Action dated Apr. 19, 2017, in Application No. 201410648464.3.

* cited by examiner

SYSTEMS AND METHODS FOR DRIVING A BIPOLAR JUNCTION TRANSISTOR BY ADJUSTING BASE CURRENT WITH TIME

1. CROSS-REFERENCES TO RELATED APPLICATIONS

This application is a continuation of U.S. patent application Ser. No. 13/213,931, filed Aug. 19, 2011, issued May 13, 2014 as U.S. Pat. No. 8,723,558, which claims priority to Chinese Patent Application No. 201110171960.0, filed Jun. 20, 2011, both applications being commonly assigned and incorporated by reference herein for all purposes.

2. BACKGROUND OF THE INVENTION

The present invention is directed to integrated circuits. More particularly, the invention provides systems and methods for driving a bipolar junction transistor. Merely by way of example, the invention has been applied to drive a bipolar junction transistor using a base current that changes with time. But it would be recognized that the invention has a much broader range of applicability.

Bipolar junction transistors (BJTs) have been widely used as power switches in power electronic systems. FIG. 1(A) shows a simplified cross-section of a conventional N-P-N bipolar junction transistor (BJT). The N-P-N BJT 102 includes a p-type-doped layer 106, a lightly n-type-doped layer 108, and a heavily n-type-doped layer 110. The layer 110 is connected to a terminal 118 (e.g., the terminal "C" representing a collector), and the layer 108 serves as a collector drift region. As shown in FIG. 1(A), there are three heavily-doped regions in the layer 106, including a heavily p-type-doped region 112 and two heavily n-type-doped regions 114. The region 112 is connected to a terminal 116 (e.g., the terminal "B" representing a base), and the regions 114 are connected to a terminal 120 (e.g., the terminal "E" representing an emitter). Often, the N-P-N BJT 102 is turned on by injecting a current into the region 112 which causes electrons to flow from the regions 114 to the layer 110. FIG. 1(B) shows a simplified schematic symbol for the conventional N-P-N bipolar junction transistor 102. The schematic symbol 104 includes the terminals 116, 118, and 120, which represent the base, the collector, and the emitter, respectively. An arrow 122 for the terminal 120 points in the direction of a current flow if the N-P-N BJT 102 is turned on.

FIG. 2 is a simplified conventional diagram showing the collector current as a function of collector-to-emitter voltage of the N-P-N BJT 102. As shown, the N-P-N BJT can operate in at least a linear region, a quasi-saturation region, and a hard saturation region. In the linear region, the collector current (e.g., $I_c$) remains constant with respect to the collector-to-emitter voltage (e.g., $V_{ce}$) for a specific base current (e.g., $I_b$). Additionally, if the collector-to-emitter voltage ($V_{ce}$) is sufficiently reduced, the BJT 102 enters the quasi-saturation region, and if the collector-to-emitter voltage ($V_{ce}$) is sufficiently further reduced, the BJT 102 enters the hard-saturation region.

The power switches used in power electronic systems often are required to provide a high switching speed, a low on-state output impedance, and a high off-state output impedance. Thus, as a power switch, the BJT 102 usually operates in the hard-saturation region when the BJT 102 is turned on in order to keep the output impedance low. But the maximum switching frequency of the BJT 102 often is limited in the hard-saturation region. For example, when the BJT 102 enters the hard-saturation region, a lot of minority carriers are accumulated in the base; therefore these minority carriers usually need to be removed before the BJT 102 can be turned off. The time needed for removing the accumulated minority carriers is referred to as a storage time, which represents the time when the BJT 102 remains on even after the base current has dropped to approximately zero. Therefore the storage time of the minority carriers can limit the maximum switching frequency of the BJT 102.

To raise the maximum switching frequency of the BJT 102, the amount of the minority carriers stored in the base need to be reduced. For example, a negative base current is used to sweep out the minority carriers from the base of the BJT 102. But, when the BJT 102 operates in the hard-saturation region, it often is difficult to quickly turn off the BJT 102 by using the negative base current, because before the BJT 102 is turned off, carriers would be stored into the base region of BJT 102.

In another example, in order to reduce the amount of the minority carriers stored in the base, the BJT 102 is prevented from entering the hard-saturation region so that the BJT 102 can be turned off quickly. But this approach can significantly increase the on-state power consumption of the BJT 102. The collector-to-emitter voltage (e.g., $V_{ce}$) usually is higher in the quasi-saturation region than in the hard saturation region for the same base current in order to generate the same collector current.

FIG. 3(A) is a simplified diagram showing a conventional flyback power conversion system. The flyback power conversion system 300 includes at least a BJT 304, a controller 306, and a resistor 308. The BJT 304 (e.g., the BJT 102) is used as a power switch, and the controller 306 is used to drive the BJT 304. The BJT 304 includes an emitter, a collector, and a base, and the controller 306 includes terminals 310 and 312. The emitter of the BJT 304 is connected to the resistor 308, and the base of the BJT 304 is connected to the controller 306 through the terminal 310 (e.g., a terminal "DRV"). As shown in FIG. 3(A), the controller 306 provides a base current 305 through the terminal 310 in order to turn on or off the BJT 304. If the BJT 304 is turned on, an emitter current of the BJT 304 flows through the resistor 308, which generates a voltage signal 309. The voltage signal 309 is received by the controller 306 through the terminal 312 (e.g., a terminal "CS").

FIG. 3(B) is a simplified conventional timing diagram for the flyback power conversion system 300. The waveform 314 represents turned-on and turned-off conditions of the BJT 304 as a function of time, the waveform 316 represents the base current 305 as a function of time, and the waveform 318 represents the voltage signal 309 as a function of time. As shown in FIG. 3(B), when the BJT 304 is turned on (e.g., during $t_0$), the base current 305 remains constant, and the voltage signal 309 increases over time.

This conventional technique of driving the BJT 304 may turn on the BJT 304 and quickly drive the BJT 304 into hard saturation so as to reduce power consumption during the turn-on process. But the constant base current 305 (e.g., as shown by the waveform 316 during $t_0$) often makes it more difficult to sweep out the minority carriers stored in the base of the BJT 304 during the turn-off process. Hence, the turn-off process for the BJT 304 often is long, and the power consumption of the BJT 304 can be high.

Hence it is highly desirable to improve techniques of driving a bipolar junction transistor.

3. BRIEF SUMMARY OF THE INVENTION

The present invention is directed to integrated circuits. More particularly, the invention provides systems and methods for driving a bipolar junction transistor. Merely by way of example, the invention has been applied to drive a bipolar junction transistor using a base current that changes with time. But it would be recognized that the invention has a much broader range of applicability.

According to one embodiment, a system for driving a bipolar junction transistor for a power converter includes a current generator configured to output a drive current signal to a bipolar junction transistor to adjust a primary current flowing through a primary winding of a power converter. The current generator is further configured to output the drive current signal to turn on the bipolar junction transistor during a first time period, a second time period, and a third time period, the second time period separating the first time period from the third time period. Moreover, the current generator is configured to drive the bipolar junction transistor to operate in a hard-saturation region during the first time period and the second time period. Furthermore, the current generator is configured to drive the bipolar junction transistor to operate in a quasi-saturation region during the third time period. The first time period starts at a first time and ends at a second time. The second time period starts at a third time and ends at a fourth time. Additionally, the third time period starts at the fifth time and ends at a sixth time. The drive current signal is equal to a first current at the first time, a second current at the second time, a third current at the third time, a fourth current at the fourth time, a fifth current at the fifth time, and a sixth current at the sixth time. The second current is larger than the third current in magnitude, and the fourth current is larger than the fifth current in magnitude.

According to another embodiment, a method for driving a bipolar junction transistor for a power converter includes generating a drive current signal, and outputting the drive current signal to a bipolar junction transistor to adjust a primary current flowing through a primary winding of a power converter. The process for outputting the drive current signal to a bipolar junction transistor includes outputting the drive current signal to turn on the bipolar junction transistor during a first time period, a second time period, and a third time period, the second time period separating the first time period from the third time period. The process for outputting the drive current signal to a bipolar junction transistor further includes driving the bipolar junction transistor to operate in a hard-saturation region during the first time period and the second time period. Furthermore, the process for outputting the drive current signal to a bipolar junction transistor includes driving the bipolar junction transistor to operate in a quasi-saturation region during the third time period. The first time period starts at a first time and ends at a second time. The second time period starts at a third time and ends at a fourth time. Additionally, the third time period starts at the fifth time and ends at a sixth time. The drive current signal is equal to a first current at the first time, a second current at the second time, a third current at the third time, a fourth current at the fourth time, a fifth current at the fifth time, and the drive current signal is equal to a sixth current at the sixth time. The second current is larger than the third current in magnitude. The fourth current is larger than the fifth current in magnitude.

According to yet another embodiment, a system for driving a bipolar junction transistor for a power converter includes a current generator configured to output a drive current signal to a bipolar junction transistor to adjust a primary current flowing through a primary winding of a power converter. The current generator is further configured to drive the bipolar junction transistor to operate in a hard-saturation region during a first time period and a second time period. The first time period is followed by the second time period. The first time period starts at a first time and ends at a second time. The second time period starts at a third time and ends at a fourth time. The drive current signal is equal to a first current at the first time, a second current at the second time, a third current at the third time, a fourth current at the fourth time. The current generator is further configured to receive a feedback signal associated with the primary current, and generate the drive current signal based on at least information associated with the feedback signal during at least the second time period. The second current is larger than the third current in magnitude, and the second time and the third time are the same.

According to yet another embodiment, a method for driving a bipolar junction transistor for a power converter includes generating a drive current signal, and outputting the drive current signal to a bipolar junction transistor to adjust a primary current flowing through a primary winding of a power converter. The process for outputting the drive current signal to a bipolar junction transistor includes driving the bipolar junction transistor to operate in a hard-saturation region during a first time period and a second time period. The process for driving the bipolar junction transistor to operate in a hard-saturation region during a first time period and a second time period includes receiving a feedback signal associated with the primary current, and generating the drive current signal based on at least information associated with the feedback signal during at least the second time period. The first time period is followed by the second time period. The first time period starts at a first time and ends at a second time. The second time period starts at a third time and ends at a fourth time. The drive current signal is equal to a first current at the first time, a second current at the second time, a third current at the third time, a fourth current at the fourth time. The second current is larger than the third current in magnitude, and the second time and the third time are the same.

According to yet another embodiment, a system for driving a bipolar junction transistor for a power converter includes a current generator configured to output a drive current signal to a bipolar junction transistor to adjust a primary current flowing through a primary winding of a power converter. The current generator is further configured to output the drive current signal to turn on the bipolar junction transistor during a first time period and a second time period, the first time period being followed by the second time period. Moreover, the current generator is configured to drive the bipolar junction transistor to operate in a hard-saturation region during the first time period. Furthermore, the current generator is configured to drive the bipolar junction transistor to operate in a quasi-saturation region during the second time period. The first time period starts at a first time and ends at a second time. The second time period starts at a third time and ends at a fourth time. The drive current signal is equal to a first current at the first time, a second current at the second time, a third current at the third time, and a fourth current at the fourth time. The current generator is further configured to receive a feedback signal associated with the primary current, and generate the drive current signal based on at least information associated with the feedback signal during at least the first time period. The second current is larger than the third current in magnitude, and the second time and the third time are the same.

According to yet another embodiment, a method for driving a bipolar junction transistor for a power converter includes generating a drive current signal, and outputting the drive current signal to a bipolar junction transistor to adjust a primary current flowing through a primary winding of a power converter. The process for outputting the drive current signal to a bipolar junction transistor includes outputting the drive current signal to turn on the bipolar junction transistor during a first time period and a second time period. The process for outputting the drive current signal to turn on the bipolar junction transistor during a first time period and a second time period includes driving the bipolar junction transistor to operate in a hard-saturation region during the first time period, and driving the bipolar junction transistor to operate in a quasi-saturation region during the second time period. The first time period is followed by the second time period. The first time period starts at a first time and ends at a second time. The second time period starts at a third time and ends at a fourth time. The drive current signal is equal to a first current at the first time, a second current at the second time, a third current at the third time, and a fourth current at the fourth time. The second current is larger than the third current in magnitude, and the second time and the third time are the same.

According to yet another embodiment, a system for driving a bipolar junction transistor for a power converter includes a current generator configured to output a drive current signal to a bipolar junction transistor to adjust a primary current flowing through a primary winding of a power converter. The current generator is further configured to output the drive current signal to turn on the bipolar junction transistor during a first time period and a second time period and to turn off the bipolar junction transistor during a third time period and a fourth time period. Moreover, the current generator is configured to drive the bipolar junction transistor to operate in a hard-saturation region during the first time period. Furthermore, the current generator is configured to drive the bipolar junction transistor to operate in a quasi-saturation region during the second time period. The first time period is followed by the second time period. The second time period is followed by the fourth time period. The first time period is preceded by the third time period. The first time period starts at a first time and ends at a second time. The second time period starts at a third time and ends at a fourth time. The third time period ends at a fifth time, and the fourth time period starts at a sixth time. The drive current signal is equal to a first current at the first time, a second current at the second time, a third current at the third time, a fourth current at the fourth time, a fifth current at the fifth time, and a sixth current at the sixth time. The second current is larger than the third current in magnitude. The fifth current is smaller than the first current in magnitude, and the sixth current is different from the fourth current.

According to yet another embodiment, a method for driving a bipolar junction transistor for a power converter includes generating a drive current signal, and outputting the drive current signal to a bipolar junction transistor to adjust a primary current flowing through a primary winding of a power converter. The process for outputting the drive current signal to a bipolar junction transistor includes outputting the drive current signal to turn on the bipolar junction transistor during a first time period and a second time period, and outputting the drive current signal to turn off the bipolar junction transistor during a third time period and a fourth time period. The process for outputting the drive current signal to turn on the bipolar junction transistor during a first time period and a second time period includes driving the bipolar junction transistor to operate in a hard-saturation region during the first time period, and driving the bipolar junction transistor to operate in a quasi-saturation region during the second time period. The first time period is followed by the second time period. The second time period is followed by the fourth time period. The first time period is preceded by the third time period. The first time period starts at a first time and ends at a second time. The second time period starts at a third time and ends at a fourth time. The third time period ends at a fifth time, and the fourth time period starts at a sixth time. The drive current signal is equal to a first current at the first time, a second current at the second time, a third current at the third time, a fourth current at the fourth time, a fifth current at the fifth time, and a sixth current at the sixth time. The second current is larger than the third current in magnitude. The fifth current is smaller than the first current in magnitude, and the sixth current is different from the fourth current.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

The present invention is directed to integrated circuits. More particularly, the invention provides systems and methods for driving a bipolar junction transistor. Merely by way of example, the invention has been applied to drive a bipolar junction transistor using a base current that changes with time. But it would be recognized that the invention has a much broader range of applicability.

Figure 1:
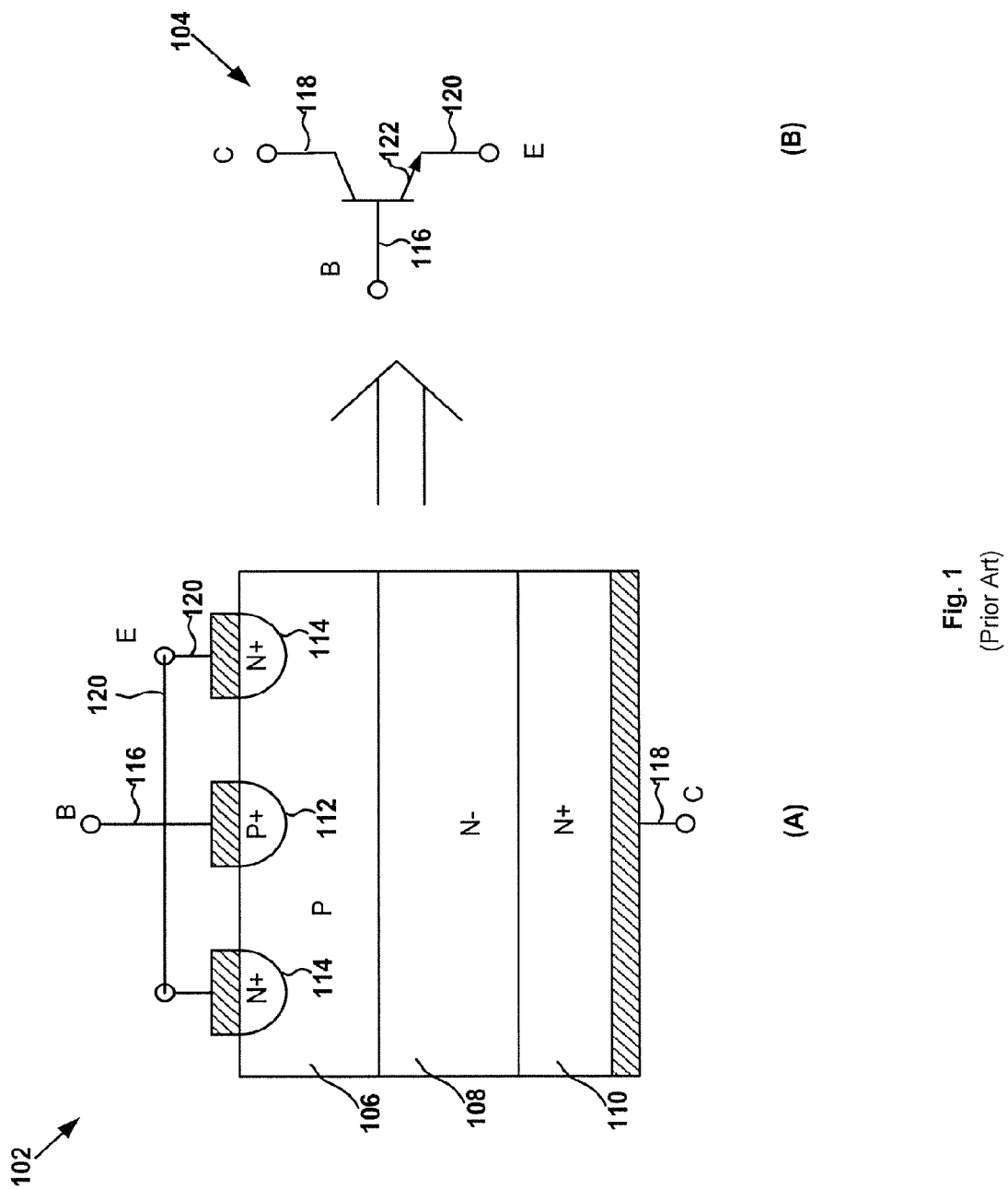
FIG. 1(A) shows a simplified cross-section of a conventional N-P-N bipolar junction transistor (BJT).
FIG. 1(B) shows a simplified schematic symbol for the conventional N-P-N bipolar junction transistor.
Figure 2:
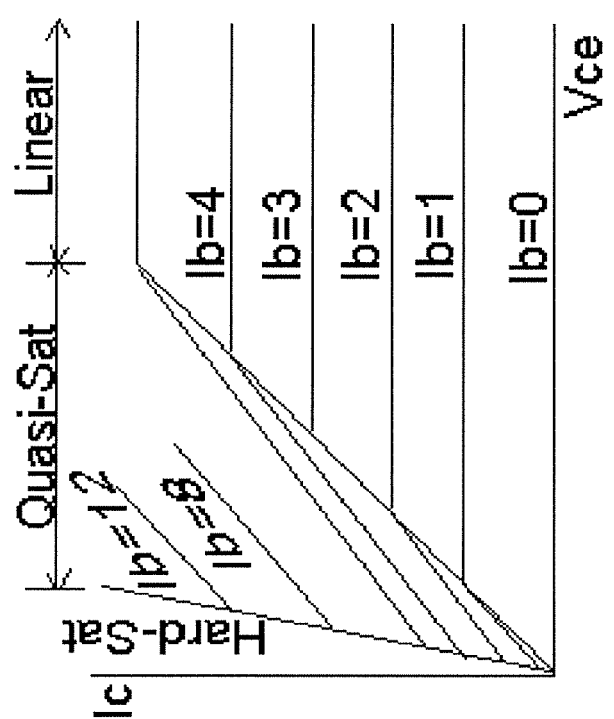
FIG. 2 is a simplified conventional diagram showing the collector current as a function of collector-to-emitter voltage of the N-P-N BJT.
Figure 3A:
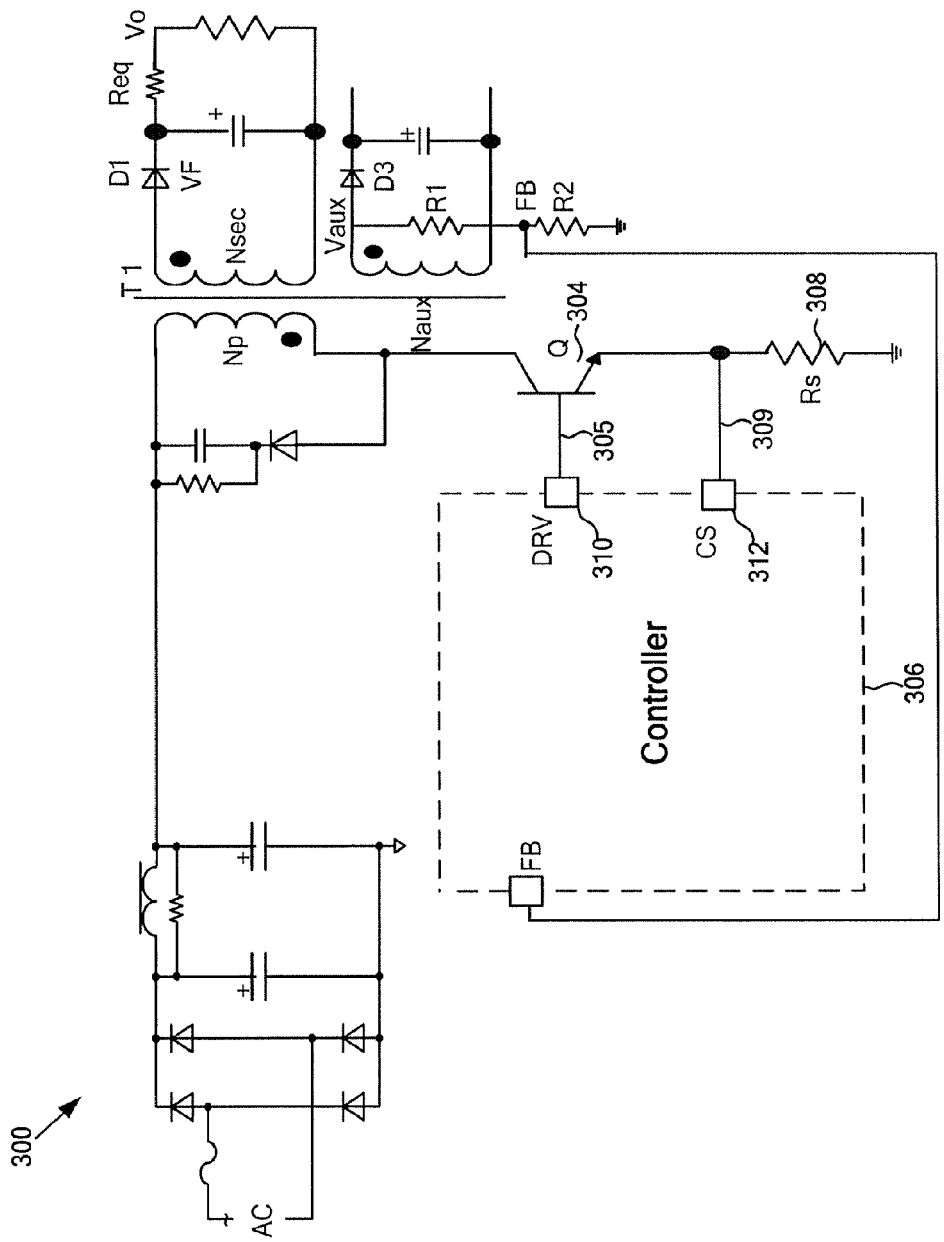
FIG. 3(A) is a simplified diagram showing a conventional flyback power conversion system.
Figure 3B:
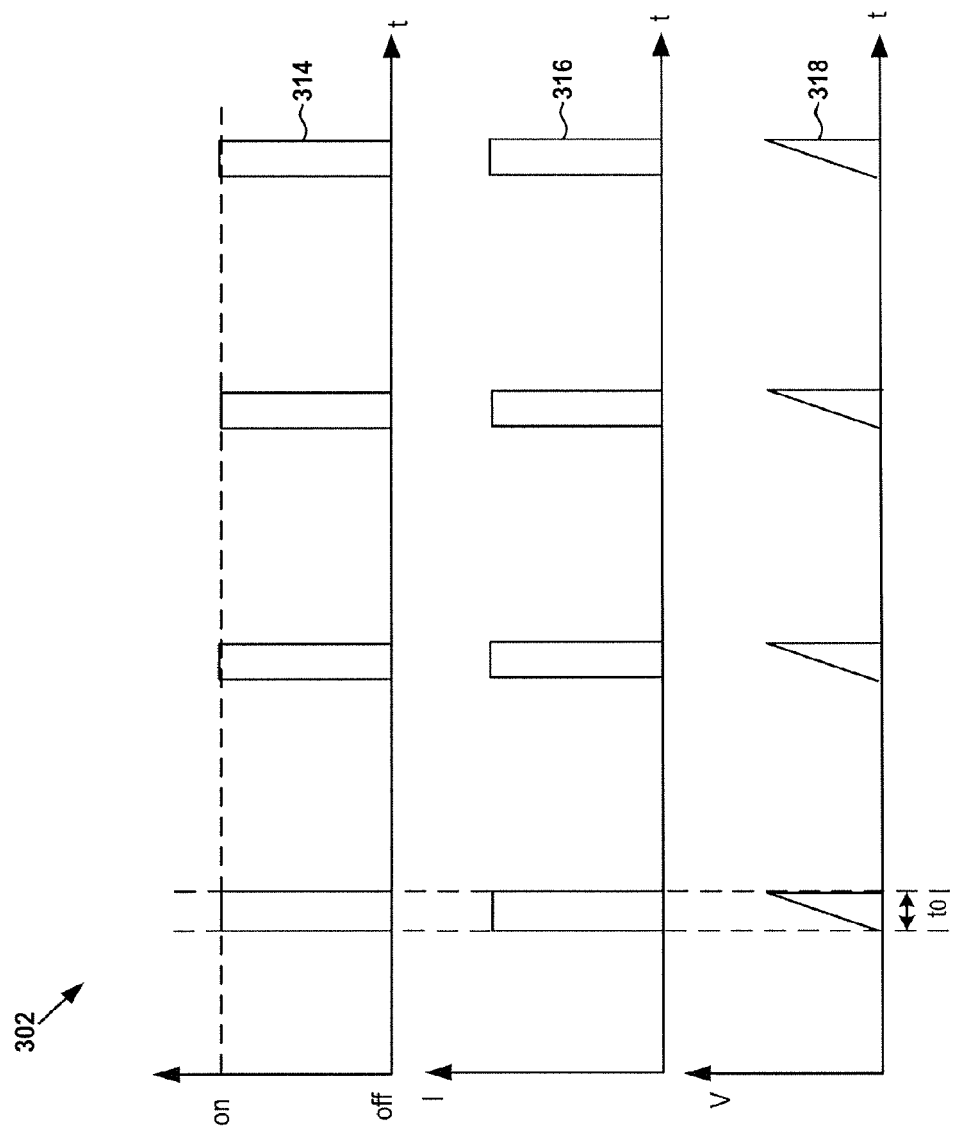
FIG. 3(B) is a simplified conventional timing diagram for the flyback power conversion system.
Figure 4A:
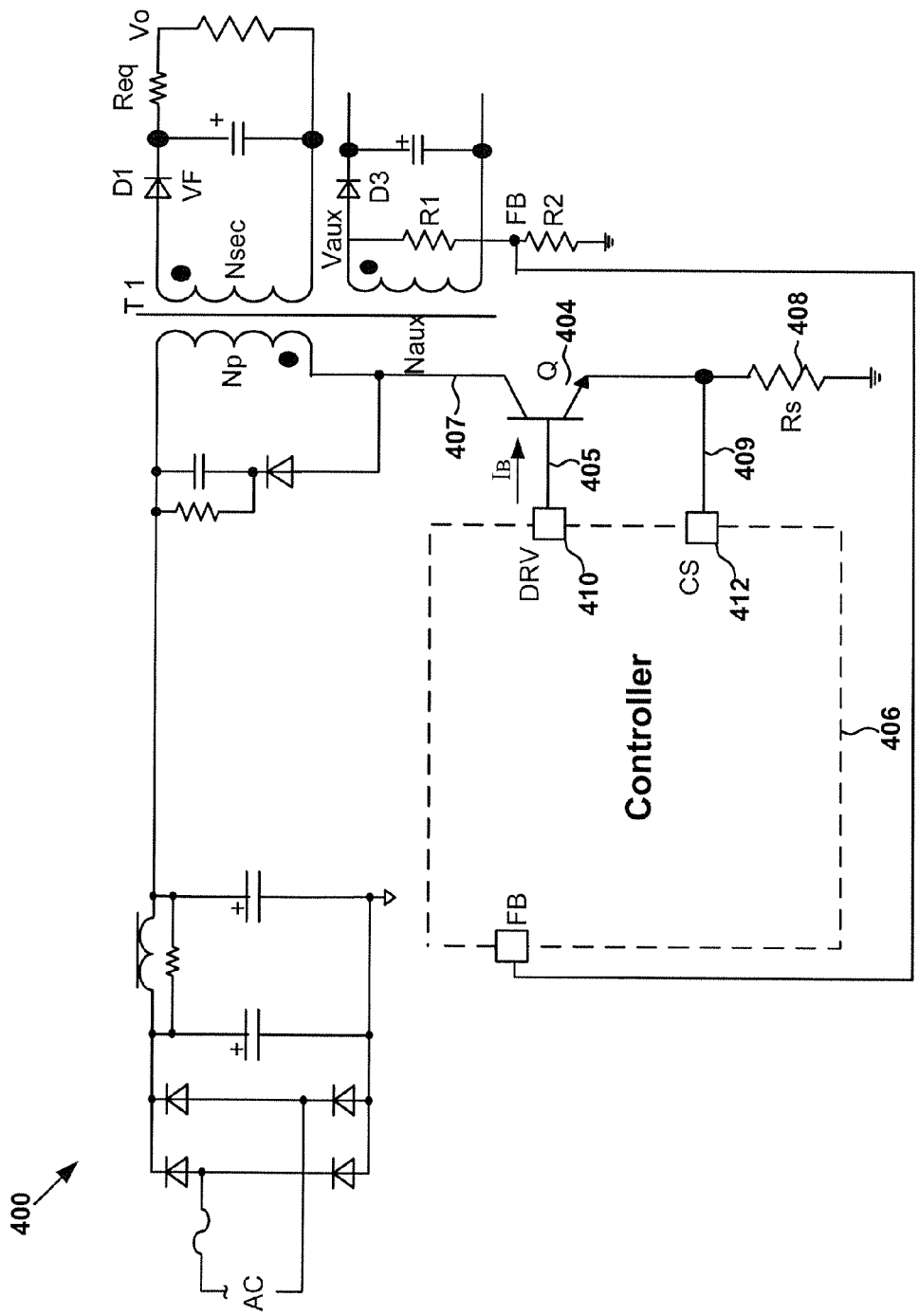
FIG. 4(A) is a simplified diagram showing a power conversion system according to an embodiment of the present invention.

FIG. 4(A) is a simplified diagram showing a power conversion system according to an embodiment of the present invention. The power conversion system 400 includes at least a BJT 404, a controller 406, and a resistor 408. This diagram is merely an example, which should not unduly limit the scope of the claims. One of ordinary skill in the art would recognize many variations, alternatives, and modifications. For example, the power conversion system 400 is a flyback power converter. In another example, the BJT 404 and the resistor 408 are the same as the BJT 304 and the resistor 308 respectively.

According to one embodiment, the BJT 404 is used as a power switch, and the controller 406 is used to drive the BJT 404. For example, the BJT 404 includes an emitter, a collector, and a base, and the controller 406 includes terminals 410 and 412. In another example, the emitter of the BJT 404 is connected to the resistor 408, and the base of the BJT 404 is connected to the controller 406 through the terminal 410 (e.g., a terminal "DRV"). According to another embodiment, the controller 406 provides a base current 405 through the terminal 410 in order to turn on or off the BJT 404. For example, if the BJT 404 is turned on, an emitter current of the BJT 404 flows through the resistor 408, which generates a voltage signal 409. In another example, the voltage signal 409 is received by the controller 406 through the terminal 412 (e.g., a terminal "CS").

Figure 4B:
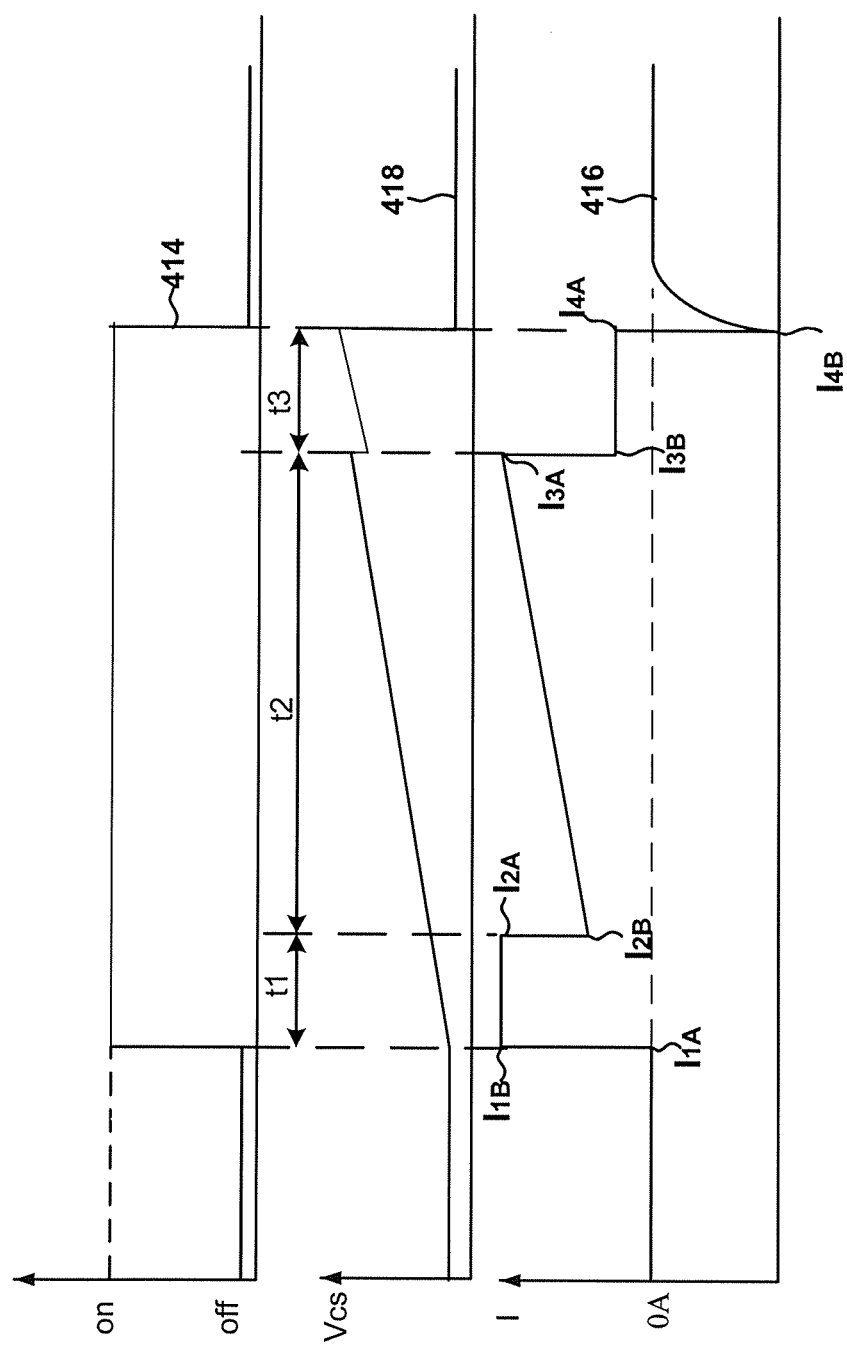
FIG. 4(B) is a simplified timing diagram for the power conversion system according to an embodiment of the present invention.

FIG. 4(B) is a simplified timing diagram for the power conversion system 400 according to an embodiment of the present invention. This diagram is merely an example, which should not unduly limit the scope of the claims. One of ordinary skill in the art would recognize many variations, alternatives, and modifications. The waveform 414 represents turned-on and turned-off conditions of the BJT 404 as a function of time, the waveform 416 represents the base current 405 as a function of time, and the waveform 418 represents the voltage signal 409 as a function of time.

In one embodiment, during time periods $t_1$, $t_2$ and $t_3$, the BJT 404 is turned on (e.g., as shown by the waveform 414) and the base current 405 (e.g., as shown by the waveform 416) changes with time. For example, during the time period $t_1$, the base current 405 drives the BJT 404 into the hard-saturation region. In another example, during the time period $t_2$, the base current increases with time and the BJT 404 remains at the hard-saturation region. In yet another example, during the time period $t_3$, the BJT 404 exits the hard-saturation region and enters into the quasi-saturation region.

In another embodiment, the base current 405 and the collector current 407 have the following relationship in order to keep the BJT 404 in hard saturation:

$$\beta_{min} I_B > I_C \quad \text{(Equation 1)}$$

where $I_B$ represents the base current 405, and $I_C$ represents the collector current 407. Additionally, $\beta_{min}$ represents a minimum current gain of the BJT 404 in a linear region.

As shown in FIG. 4(B), $I_{1A}$, $I_{1B}$, $I_{2A}$, $I_{2B}$, $I_{3A}$, $I_{3B}$, $I_{4A}$, and $I_{4B}$ each represent the base current 405 at different times according to some embodiments. For example, if the base current 405 is positive, the base current flows into the base of the BJT 404. In another example, if the base current 405 is negative, the base current 405 flows out of the base of the BJT 404.

According to one embodiment, at the beginning of the time period $t_1$ the base current 405 jumps from $I_{1A}$ to $I_{1B}$ (e.g., as shown by a rising edge of the waveform 416), and at the end of the time period $t_1$ the base current 405 drops from $I_{2A}$ to $I_{2B}$ (e.g., as shown by a falling edge of the waveform 416). For example, $I_{1B}$ is equal to $I_{2A}$. In another example, during the time period $t_1$, the base current 405 remains constant at $I_{1B}$. According to another embodiment, during the time period $t_2$, the base current 405 changes with time from $I_{2B}$ to $I_{3A}$. (e.g., as shown by the waveform 416). For example, during the time period $t_2$, the base current 405 changes (e.g., increases linearly, or non-linearly) with time from $I_{2B}$ to $I_{3A}$. According to yet another embodiment, at the beginning of the time period $t_3$ the base current 405 drops from $I_{3A}$ to $I_{3B}$ (e.g., as shown by the falling edge of the waveform 416), and at the end of the time period $t_3$ the base current 405 changes from $I_{4A}$ to $I_{4B}$ (e.g., as shown by a falling edge of the waveform 416). For example, $I_{4B}$ is a negative current for turning off the BJT 404. As another example, $I_{3B}$ is equal to $I_{4A}$. In another example, during the time period $t_3$, the base current 405 remains constant at $I_{3B}$.

As shown in FIGS. 4(A) and (B), the adjustment of the base current 405 during the time periods $t_1$, $t_2$ and $t_3$ can raise switching speed and/or lower power consumption according to some embodiments. For example, at the end of the time period $t_3$, the BJT 404 can be quickly turned off because at least a significant portion of minority carriers accumulated in the base of the BJT 404 have already been swept out during the time period $t_3$.

As discussed above and further emphasized here, FIG. 4(A) is merely an example, which should not unduly limit the scope of the claims. One of ordinary skill in the art would recognize many variations, alternatives, and modifications. For example, the power conversion system 400 is replaced by another power switching structure, such as a Boost structure and/or a Buck structure.

Figure 5:
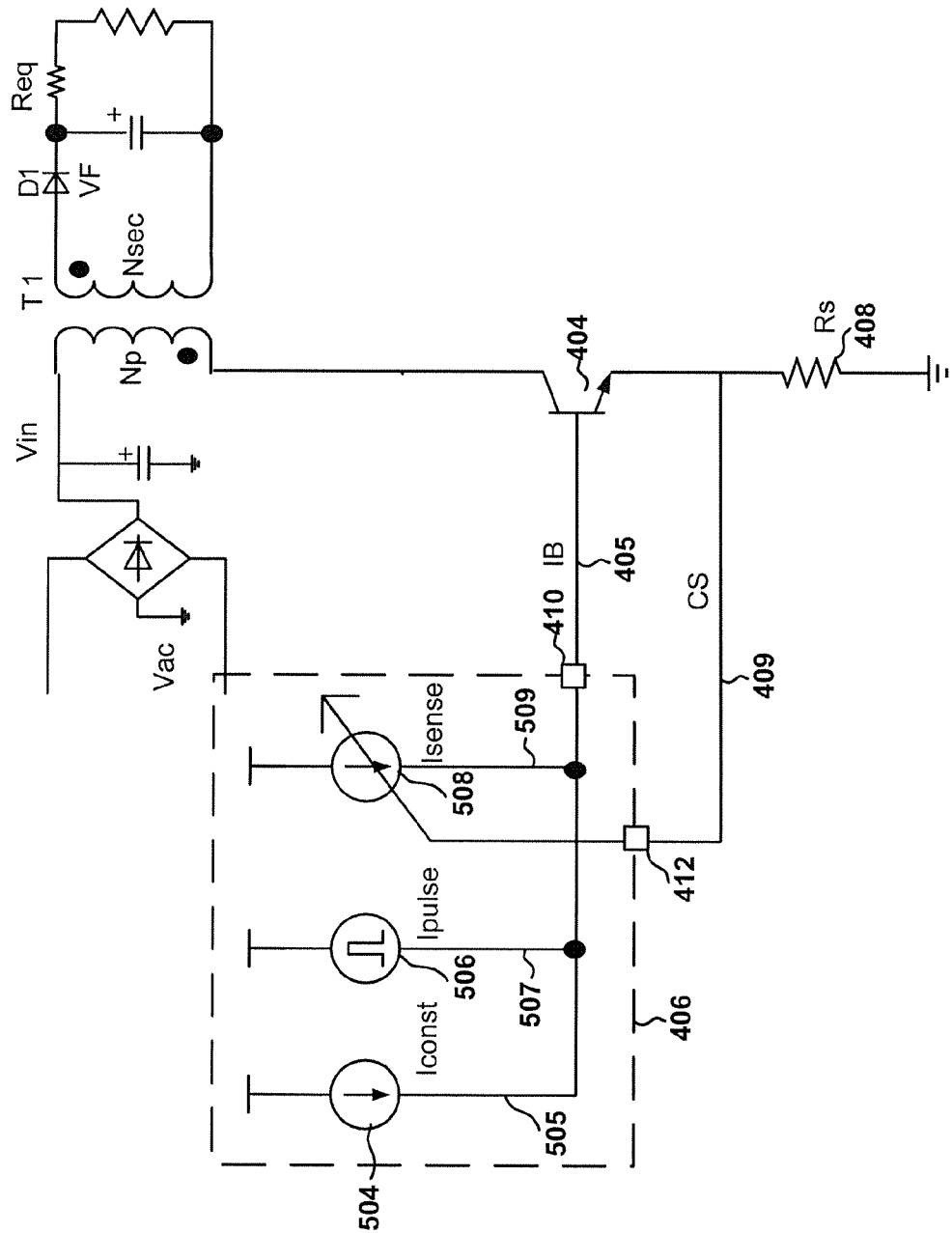
FIG. 5 is a simplified diagram showing certain components of the controller as part of the power conversion system according to an embodiment of the present invention.

FIG. 5 is a simplified diagram showing certain components of the controller 406 as part of the power conversion system 400 according to an embodiment of the present invention. This diagram is merely an example, which should not unduly limit the scope of the claims. One of ordinary skill in the art would recognize many variations, alternatives, and modifications. The controller 406 includes at least three current sources 504, 506, and 508.

In one embodiment, the current source 504 provides a constant current 505 (e.g., $I_{const}$). For example, the constant current remains constant throughout at least the time periods $t_1$ and $t_2$. In another embodiment, the current source 506 provides a pulse current 507 (e.g., $I_{pulse}$). For example, the pulse current 507 includes only one pulse during the time periods $t_1$, $t_2$ and $t_3$, and the pulse has a rising edge and a falling edge that correspond to the beginning and the end of the time period $t_1$ respectively.

In yet another embodiment, the current source 508 provides a current 509 (e.g., $I_{sense}$). For example, the current 509 changes with time (e.g., increases with time, linearly or non-linearly) throughout at least the time period $t_2$. In another example, during at least the time period $t_2$, the current source 508 receives a signal (e.g., the voltage signal 409) that represents the current flowing through the BJT 404 and determines the magnitude of the current 509 based on information associated with this signal (e.g., the voltage signal 409).

According to one embodiment, the pulse current 506 is used to turn on the BJT 404 and drive the BJT 404 into the hard-saturation region. For example, the magnitude of the pulse current 506 is close to an upper limit of a driving current for the BJT 404. According to another embodiment, the current 509 is generated by sensing the current flowing through the BJT 404 and is used to ensure the BJT 404 remains in the hard-saturation region during at least the time period $t_2$, by, for example, satisfying Equation 1.

Figure 6A:
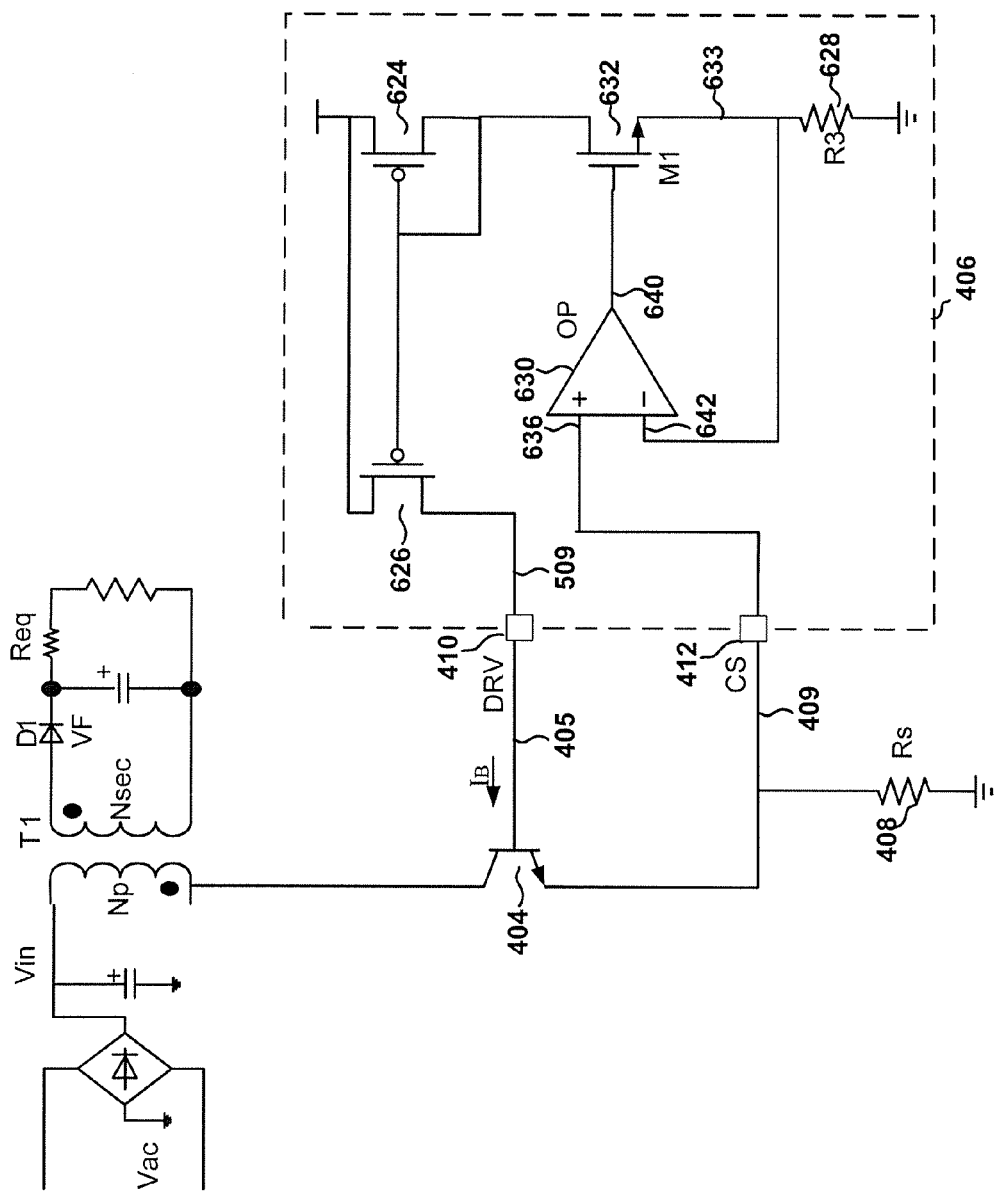
FIG. 6(A) is a simplified diagram showing certain components of the current source as part of the power conversion system according to an embodiment of the present invention.

FIG. 6(A) is a simplified diagram showing certain components of the current source 508 as part of the power conversion system 400 according to an embodiment of the present invention. This diagram is merely an example, which should not unduly limit the scope of the claims. One of ordinary skill in the art would recognize many variations, alternatives, and modifications. The current source 508 includes a pair of transistors 624 and 626 forming a current mirror circuit, a resistor 628, an operational amplifier 630, and a transistor 632.

As shown in FIG. 6(A), the current source 508 (e.g., as a voltage-to-current converter) generates the current 509, which is used as at least a part of the base current 405 according to one embodiment. For example, the operational amplifier 630 receives the voltage signal 409 at an input terminal 636, and in response generates an amplified signal 640. In another example, the amplified signal 640 is received by the transistor 632, which is also coupled to another input terminal 642 of the operational amplifier 630. As a result, the transistor 632 generates a current signal 633, which flows through both the transistor 624 and the resistor 628. According to another embodiment, the current signal 633 is mirrored, with a predetermined ratio, by the transistor 626 in order to generate the current 509.

As discussed above and further emphasized here, FIG. 5 is merely an example, which should not unduly limit the scope of the claims. One of ordinary skill in the art would recognize many variations, alternatives, and modifications. For example, the current source 508 receives a current signal, instead of the voltage signal 409, that represents the current flowing through the BJT 404 and determines the magnitude of the current 509 based on information associated with this current signal, as shown in FIG. 6(B).

Figure 6B:
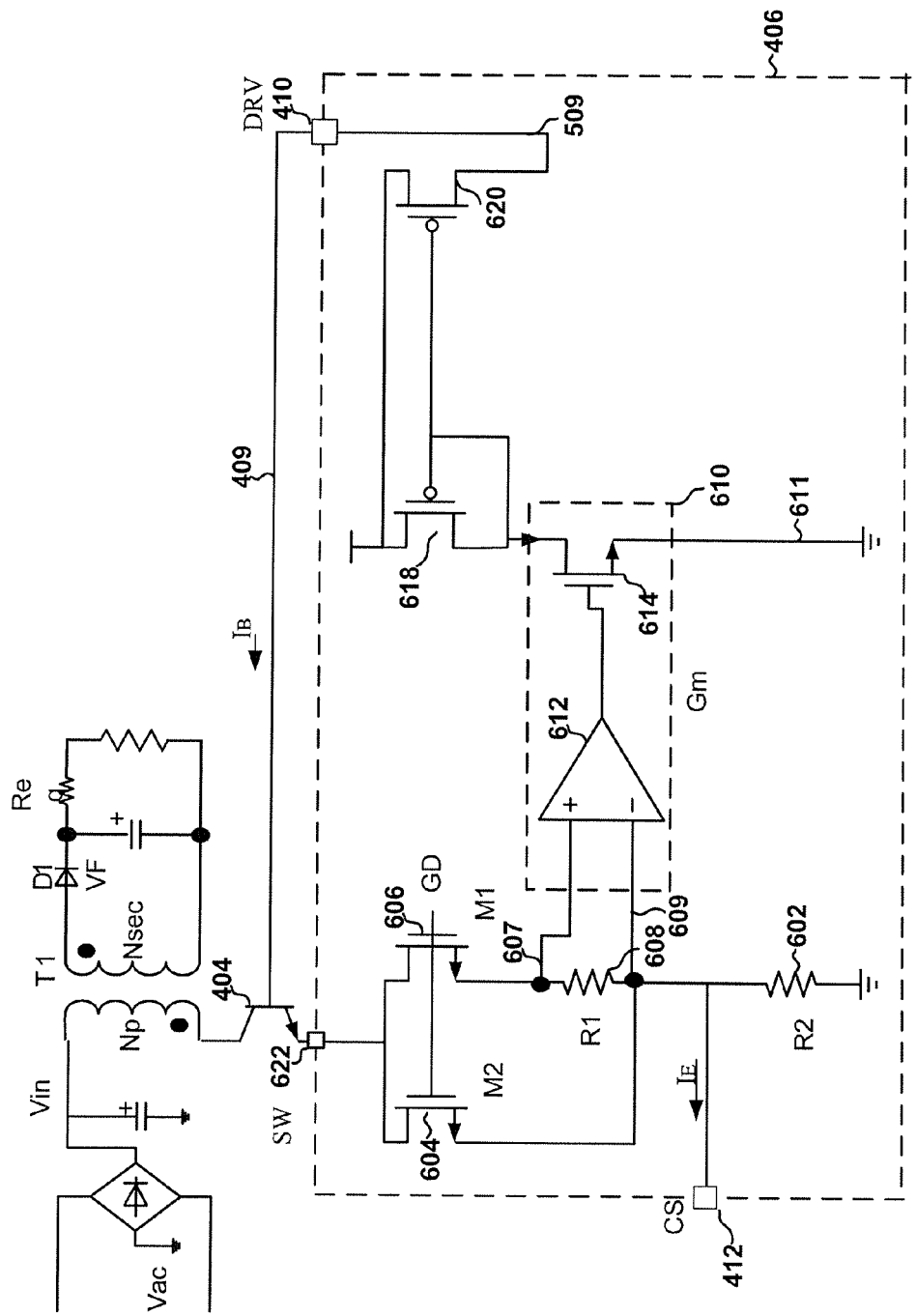
FIG. 6(B) is a simplified diagram showing certain components of the current source as part of the power conversion system according to another embodiment of the present invention.

FIG. 6(B) is a simplified diagram showing certain components of the current source 508 as part of the power conversion system 400 according to another embodiment of the present invention. This diagram is merely an example, which should not unduly limit the scope of the claims. One of ordinary skill in the art would recognize many variations, alternatives, and modifications. The current source 508 includes transistors 604 and 606, resistors 602 and 608, a transconductance amplifier 610, and transistors 618 and 620. For example, the transistors 604 and 606 form a current mirror circuit, and the transistors 618 and 620 form another current mirror circuit. In another example, the transconductance amplifier 610 includes an operational amplifier 612 and a transistor 614.

As shown in FIG. 6(B), the current source 508 generates the current 509, which is used as at least a part of the base current 405 according to one embodiment. For example, the transistors 606 and 604 receive the emitter current of the BJT 404, and in response generate signals 607 and 609 at two terminals of the resistor 608. In another example, the signals 607 and 609 are received by the transconductance amplifier 610 and converted into the current signal 611. In yet another example, the current signal 611 flows through the transistor 618, and is mirrored, with a predetermined ratio, by the transistor 620 in order to generate the current 509.

Figure 7:
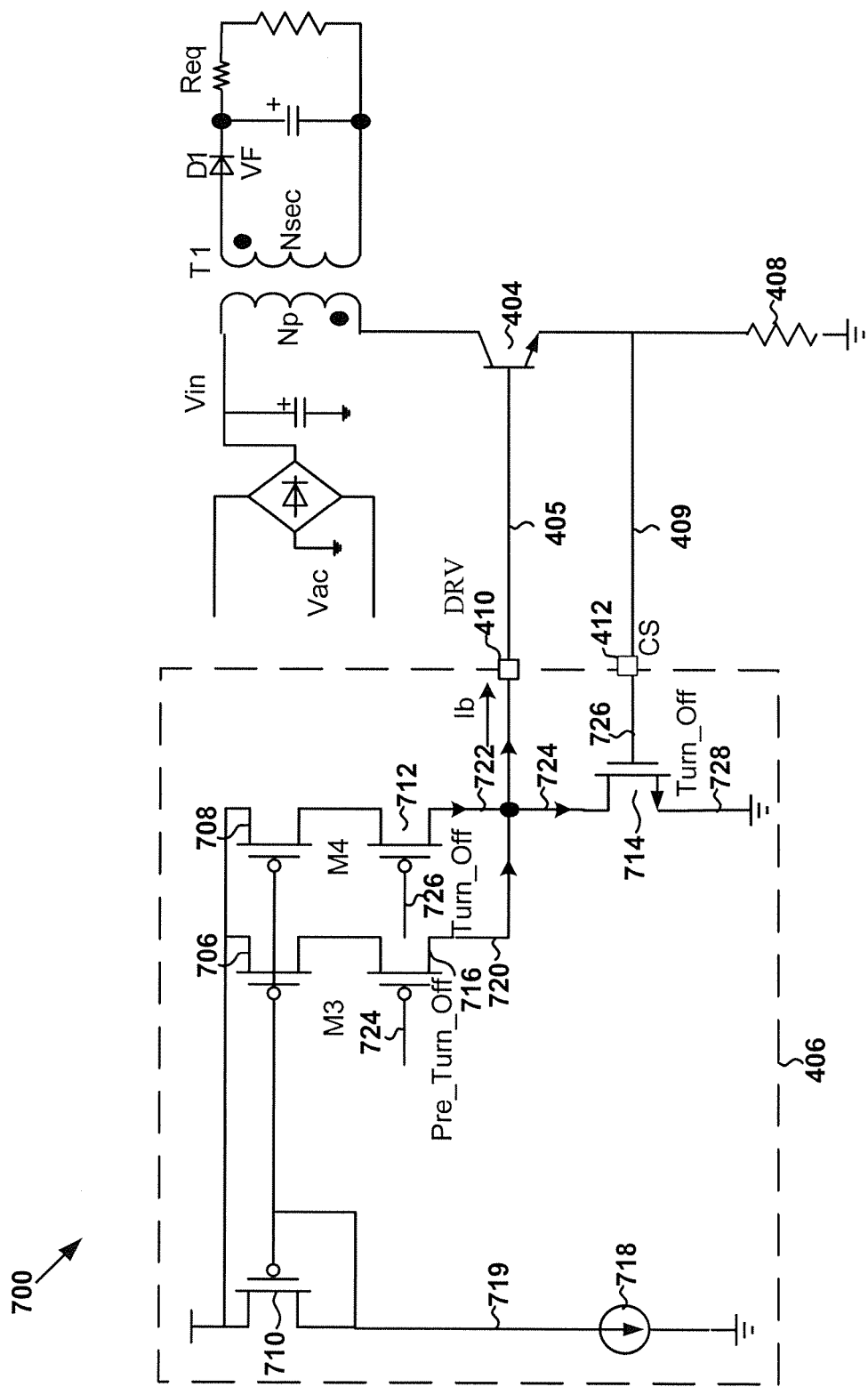
FIG. 7 is a simplified diagram showing certain components of the controller for adjusting the base current as part of the power conversion system according to an embodiment of the present invention.

FIG. 7 is a simplified diagram showing certain components of the controller 406 for adjusting the base current as part of the power conversion system 400 according to an embodiment of the present invention. This diagram is merely an example, which should not unduly limit the scope of the claims. One of ordinary skill in the art would recognize many variations, alternatives, and modifications. The controller 406 includes transistors 706, 708, 710, 712, 714 and 716 and a current source 718. For example, the transistors 712 and 716 are p-channel field-effect transistors, and the transistor 714 is an n-channel field-effect transistor. In another example, the current source 718 represents some other components of the controller 406 that generate a current 719, which also flows through the transistor 710.

In one embodiment, the transistor 706 mirrors the current 719 and generates, with the transistor 716, a current 720. For example, the transistor 716 is turned on or off by a control signal 724 (e.g., the Pre_Turn_Off signal). In another example, if the transistor 716 is turned off, the current 720 becomes zero. In another embodiment, the transistor 708 mirrors the current 719 and generates, with the transistor 712, a current 722. For example, the transistor 712 is turned on or off by a control signal 726 (e.g., the Turn_Off signal). In another example, if the transistor 712 is turned off, the current 722 becomes zero. In yet another embodiment, the transistor 714 is turned on or off by the control signal 726. For example, if the transistor 714 is turned on, the transistor 714 generates a current 728.

According to one embodiment, if the transistors 712 and 716 are turned on but the transistor 714 is turned off, the base current 405 flows from the terminal 410 to the base of the BJT 404 and is equal to the sum of the currents 720 and 722. According to another embodiment, if the transistors 712 and 716 are turned off but the transistor 714 is turned on, the base current 405 flows from the base of the BJT 404 into the terminal 410 and is equal to the current 728. For example, referring to FIG. 4(B), at the end of the time period $t_3$, the base current 405 changes its direction because $I_5$ is larger than zero and $I_6$ is smaller than zero according to certain embodiments.

According to some embodiments, if the BJT 404 is turned on (e.g., in the hard-saturation region), the control signals 724 and 726 are at a logic low level. For example, in response, the transistors 712 and 716 are turned on and the transistor 714 is turned off, thus providing the base current 405 that flows into the base of the BJT 404.

In one embodiment, the control signal 724 changes to a logic high level before the control signal 726 also changes to the logic high level. For example, in response, the transistor 716 is turned off, but the transistor 712 remains on and the transistor 714 remains off. In another example, the magnitude of the base current 405 that flows into the base of the BJT 404 is reduced, causing the BJT 404 to enter the quasi-saturation region. In another embodiment, after the control signal 724 changes to the logic high level, the control signal 726 also changes to the logic high level. For example, in response, both the transistors 712 and 716 are turned off, and the transistor 714 is turned on. In another example, the base current 405 changes its direction and flows out of the base of the BJT 404, thus sweeping out minority carriers accumulated in the base of the BJT 404 and turning off the BJT 404 quickly.

Figure 8A:
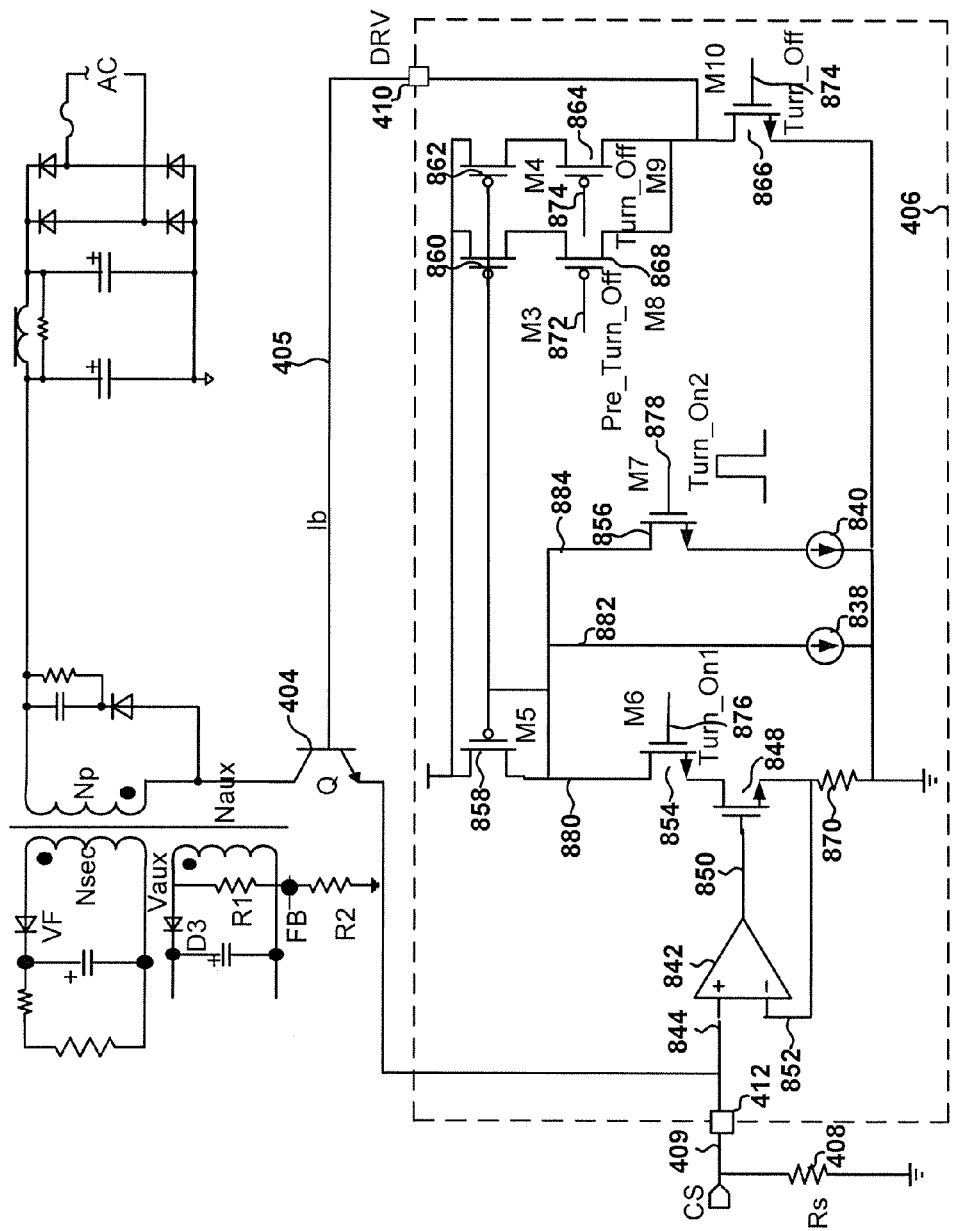
FIG. 8(A) is a simplified diagram showing certain components of the controller as part of the power conversion system according to an embodiment of the present invention.

FIG. 8(A) is a simplified diagram showing certain components of the controller 406 as part of the power conversion system 400 according to an embodiment of the present invention. This diagram is merely an example, which should not unduly limit the scope of the claims. One of ordinary skill in the art would recognize many variations, alternatives, and modifications. The controller 406 includes current sources 838 and 840, an operational amplifier 842, transistors 848, 854, 856, 858, 860, 862, 864, 866 and 868, and a resistor 870. For example, the transistors 848, 854, 856 and 866 are n-channel field-effect transistors, and the transistors 858, 860, 862, 864 and 868 are p-channel field-effect transistors. In another example, the transistor 868 receives a control signal 872, the transistors 864 and 866 receive a control signal 874, the transistor 854 receives a control signal 876, and the transistor 856 receives a control signal 878.

In one embodiment, the combination of the operational amplifier 842, the transistors 848, 858, 860 and 862, and the resistor 870 functions substantially the same as the combination of the operational amplifier 630, the transistors 624, 626 and 632, and the resistor 628 as shown in FIG. 6(A), with the transistor 632 being replaced by the transistors 860 and 862. In another embodiment, the combination of the transistors 858, 860, 862, 864, 866 and 868 functions substantially the same as the combination of the transistors 706, 708, 710, 712, 714 and 716 as shown in FIG. 7. For example, the control signal 872 is the same as the control signal 724, and the control signal 874 is the same as the control signal 726.

As shown in FIG. 8(A), current signals 880, 882, and 884 flow through the transistor 858 according to one embodiment. For example, the current signal 880 is controlled by the transistor 854, which is turned on or off by the control signal 876. In another example, the current signal 882 is generated by the current source 838. In yet another example, the current signal 884 is controlled by the transistor 856, which is turned on or off by the control signal 878 and coupled to the current source 840. According to another embodiment, the current signal 882 is a constant current, and the current signal 884 is a pulse current.

According to another embodiment, the current signals 880, 882, and 884 are summed by the transistor 858 and mirrored by the transistors 860 and 862 in order the generate a summed and mirrored current. For example, the summed and mirrored current is used to turn on and drive the BJT 404 into the hard-saturation region if the transistors 868 and 864 are turned on and the transistor 866 is turned off. In another example, afterwards, by turning off the transistor 868 first and then turning off the transistor 864 and turning on the transistor 866, the BJT 404 first enter the quasi-saturation region and then is turned off quickly.

Figure 8B:
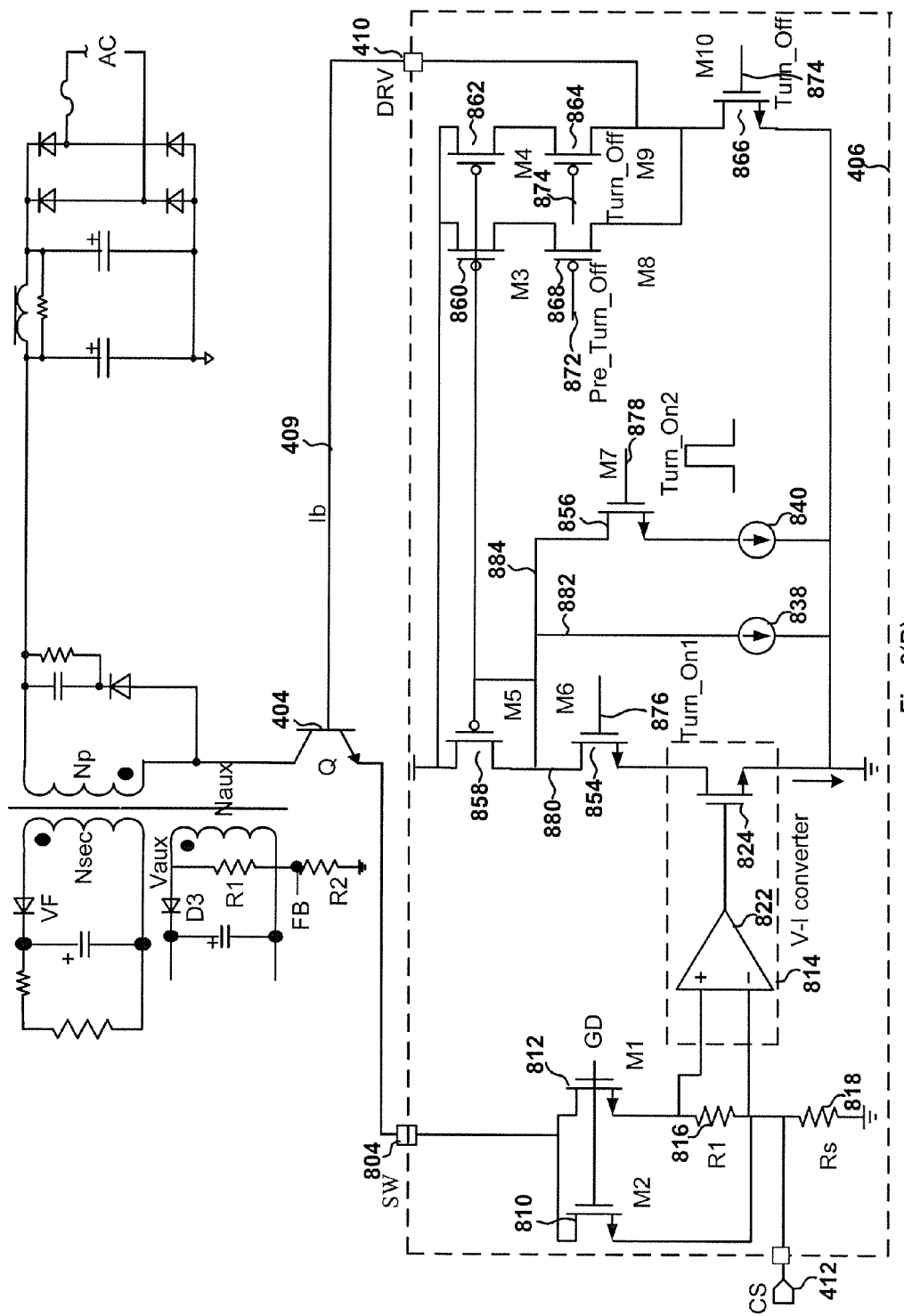
FIG. 8(B) is a simplified diagram showing certain components of the controller as part of the power conversion system according to an embodiment of the present invention.

FIG. 8(B) is a simplified diagram showing certain components of the controller 406 as part of the power conversion system 400 according to an embodiment of the present invention. This diagram is merely an example, which should not unduly limit the scope of the claims. One of ordinary skill in the art would recognize many variations, alternatives, and modifications. The controller 406 includes the current sources 838 and 840, the transistors 854, 856 and 858, and the transistors 860, 862, 864, 866 and 868. Additionally, the controller 406 includes transistors 810 and 812, resistors 816 and 818, and a transconductance amplifier 814.

For example, the transconductance amplifier 814 includes an operational amplifier 822 and a transistor 824. In another example, the transistors 810, 812, 824, 854, 856 and 866 are n-channel field-effect transistors, and the transistors 858, 860, 862, 864 and 868 are p-channel field-effect transistors. In yet another example, the transistor 868 receives the control signal 872, the transistors 864 and 866 receive the control signal 874, the transistor 854 receives the control signal 876, and the transistor 856 receives the control signal 878.

According to one embodiment, the combination of the transistors 810 and 812, the resistors 816 and 818, the transconductance amplifier 814, and the transistors 858, 860 and 862 functions substantially the same as the combination of the transistors 604 and 606, the resistors 602 and 608, the transconductance amplifier 610, and the transistors 618 and 620 as shown in FIG. 6(B), with the transistor 620 being replaced by the transistors 860 and 862. For example, a terminal 804 is the same as the terminal 622. According to another embodiment, the combination of the transistors 858, 860, 862, 864, 866 and 868 functions substantially the same as the combination of the transistors 706, 708, 710, 712, 714 and 716 as shown in FIG. 7. For example, the control signal 872 is the same as the control signal 724, and the control signal 874 is the same as the control signal 726.

Figure 9:
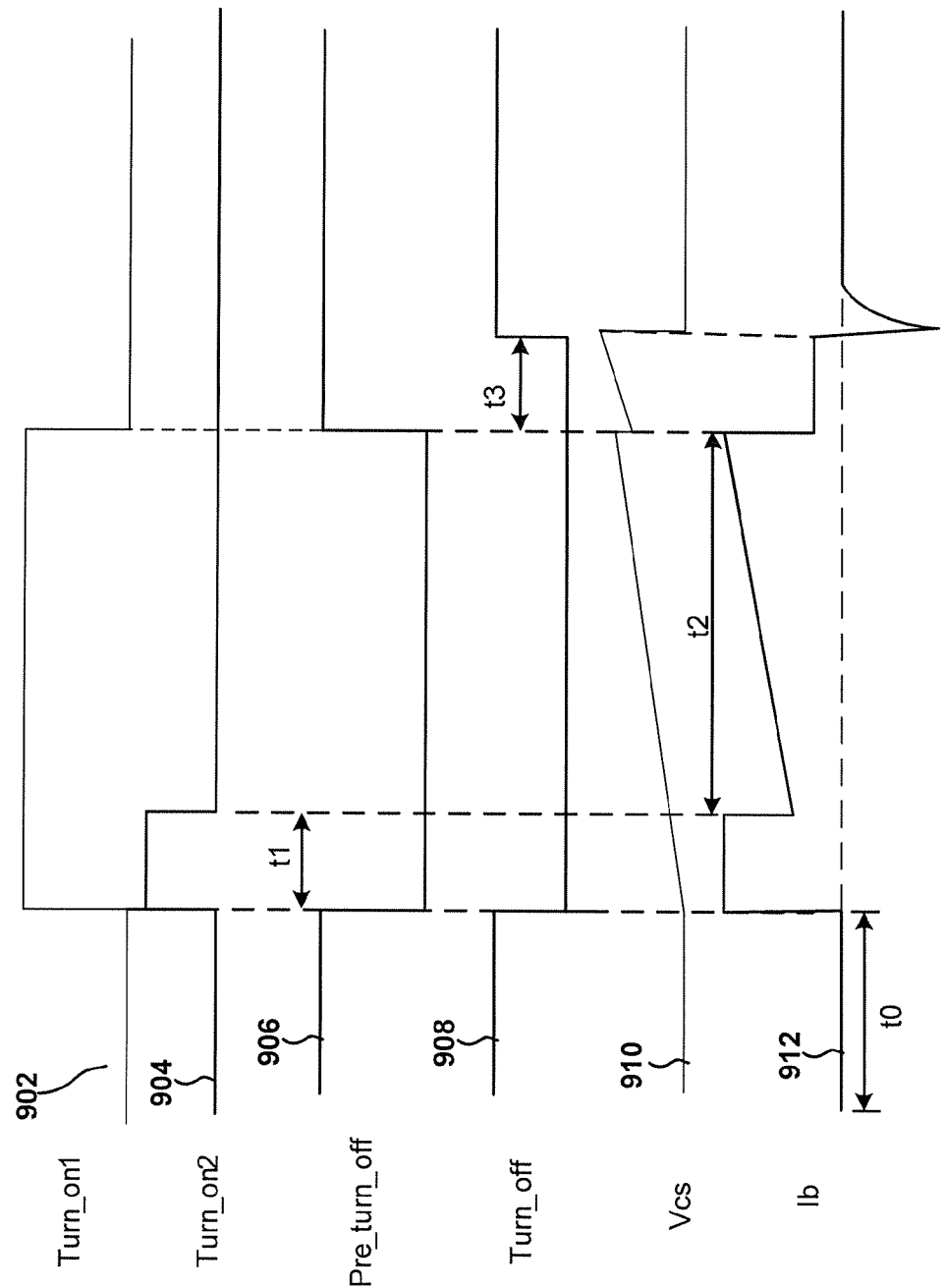
FIG. 9 is a simplified timing diagram for the power conversion system according to another embodiment of the present invention.

FIG. 9 is a simplified timing diagram for the power conversion system 400 according to another embodiment of the present invention. This diagram is merely an example, which should not unduly limit the scope of the claims. One of ordinary skill in the art would recognize many variations, alternatives, and modifications. The waveform 902 represents the control signal 876 as a function of time, the waveform 904 represents the control signal 878 as a function of time, the waveform 906 represents the control signal 872 (e.g., the control signal 724) as a function of time, and the waveform 908 represents the control signal 874 (e.g., the control signal 726) as a function of time. Additionally, the waveform 910 represents the voltage signal 409 as a function of time, and the waveform 912 represents the base current 405 as a function of time. For example, the waveform 910 is the same as the waveform 418. In another example, the waveform 912 is the same as the waveform 416.

In one embodiment, the waveforms 902, 904, 906, 908, 910, and 912 describe certain operations of FIG. 8(A). In another embodiment, the waveforms 902, 904, 906, 908, 910, and 912 describe certain operations of FIG. 8(B).

According to another embodiment, a system for driving a bipolar junction transistor for a power converter includes a current generator configured to output a drive current signal to a bipolar junction transistor to adjust a primary current flowing through a primary winding of a power converter. The current generator is further configured to output the drive current signal to turn on the bipolar junction transistor during a first time period, a second time period, and a third time period, the second time period separating the first time period from the third time period. Moreover, the current generator is configured to drive the bipolar junction transistor to operate in a hard-saturation region during the first time period and the second time period. Furthermore, the current generator is configured to drive the bipolar junction transistor to operate in a quasi-saturation region during the third time period. The first time period starts at a first time and ends at a second time. The second time period starts at a third time and ends at a fourth time. Additionally, the third time period starts at the fifth time and ends at a sixth time. The drive current signal is equal to a first current at the first time, a second current at the second time, a third current at the third time, a fourth current at the fourth time, a fifth current at the fifth time, and a sixth current at the sixth time. The second current is larger than the third current in magnitude, and the fourth current is larger than the fifth current in magnitude. For example, the system is implemented according to at least FIG. 4(A), FIG. 4(B), FIG. 5, FIG. 6(A), FIG. 6(B), FIG. 7, FIG. 8(A), FIG. 8(B), and/or FIG. 9.

According to yet another embodiment, a method for driving a bipolar junction transistor for a power converter includes generating a drive current signal, and outputting the drive current signal to a bipolar junction transistor to adjust a primary current flowing through a primary winding of a power converter. The process for outputting the drive current signal to a bipolar junction transistor includes outputting the drive current signal to turn on the bipolar junction transistor during a first time period, a second time period, and a third time period, the second time period separating the first time period from the third time period. The process for outputting the drive current signal to a bipolar junction transistor further includes driving the bipolar junction transistor to operate in a hard-saturation region during the first time period and the second time period. Furthermore, the process for outputting the drive current signal to a bipolar junction transistor includes driving the bipolar junction transistor to operate in a quasi-saturation region during the third time period. The first time period starts at a first time and ends at a second time. The second time period starts at a third time and ends at a fourth time. Additionally, the third time period starts at the fifth time and ends at a sixth time. The drive current signal is equal to a first current at the first time, a second current at the second time, a third current at the third time, a fourth current at the fourth time, a fifth current at the fifth time, and the drive current signal is equal to a sixth current at the sixth time. The second current is larger than the third current in magnitude. The fourth current is larger than the fifth current in magnitude. For example, the method is implemented according to at least FIG. 4(A), FIG. 4(B), FIG. 5, FIG. 6(A), FIG. 6(B), FIG. 7, FIG. 8(A), FIG. 8(B), and/or FIG. 9.

According to yet another embodiment, a system for driving a bipolar junction transistor for a power converter includes a current generator configured to output a drive current signal to a bipolar junction transistor to adjust a primary current flowing through a primary winding of a power converter. The current generator is further configured to drive the bipolar junction transistor to operate in a hard-saturation region during a first time period and a second time period. The first time period is followed by the second time period. The first time period starts at a first time and ends at a second time. The second time period starts at a third time and ends at a fourth time. The drive current signal is equal to a first current at the first time, a second current at the second time, a third current at the third time, a fourth current at the fourth time. The current generator is further configured to receive a feedback signal associated with the primary current, and generate the drive current signal based on at least information associated with the feedback signal during at least the second time period. The second current is larger than the third current in magnitude, and the second time and the third time are the same. For example, the system is implemented according to at least FIG. 4(A), FIG. 4(B), FIG. 5, FIG. 6(A), FIG. 6(B), FIG. 8(A), FIG. 8(B), and/or FIG. 9.

According to yet another embodiment, a method for driving a bipolar junction transistor for a power converter includes generating a drive current signal, and outputting the drive current signal to a bipolar junction transistor to adjust a primary current flowing through a primary winding of a power converter. The process for outputting the drive current signal to a bipolar junction transistor includes driving the bipolar junction transistor to operate in a hard-saturation region during a first time period and a second time period. The process for driving the bipolar junction transistor to operate in a hard-saturation region during a first time period and a second time period includes receiving a feedback signal associated with the primary current, and generating the drive current signal based on at least information associated with the feedback signal during at least the second time period. The first time period is followed by the second time period. The first time period starts at a first time and ends at a second time. The second time period starts at a third time and ends at a fourth time. The drive current signal is equal to a first current at the first time, a second current at the second time, a third current at the third time, a fourth current at the fourth time. The second current is larger than the third current in magnitude, and the second time and the third time are the same. For example, the method is implemented according to at least FIG. 4(A), FIG. 4(B), FIG. 5, FIG. 6(A), FIG. 6(B), FIG. 8(A), FIG. 8(B), and/or FIG. 9.

According to yet another embodiment, a system for driving a bipolar junction transistor for a power converter includes a current generator configured to output a drive current signal to a bipolar junction transistor to adjust a primary current flowing through a primary winding of a power converter. The current generator is further configured to output the drive current signal to turn on the bipolar junction transistor during a first time period and a second time period, the first time period being followed by the second time period. Moreover, the current generator is configured to drive the bipolar junction transistor to operate in a hard-saturation region during the first time period. Furthermore, the current generator is configured to drive the bipolar junction transistor to operate in a quasi-saturation region during the second time period. The first time period starts at a first time and ends at a second time. The second time period starts at a third time and ends at a fourth time. The drive current signal is equal to a first current at the first time, a second current at the second time, a third current at the third time, and a fourth current at the fourth time. The current generator is further configured to receive a feedback signal associated with the primary current, and generate the drive current signal based on at least information associated with the feedback signal during at least the first time period. The second current is larger than the third current in magnitude, and the second time and the third time are the same. For example, the system is implemented according to at least FIG. 4(A), FIG. 4(B), FIG. 5, FIG. 6(A), FIG. 6(B), FIG. 7, FIG. 8(A), FIG. 8(B), and/or FIG. 9.

According to yet another embodiment, a method for driving a bipolar junction transistor for a power converter includes generating a drive current signal, and outputting the drive current signal to a bipolar junction transistor to adjust a primary current flowing through a primary winding of a power converter. The process for outputting the drive current signal to a bipolar junction transistor includes outputting the drive current signal to turn on the bipolar junction transistor during a first time period and a second time period. The process for outputting the drive current signal to turn on the bipolar junction transistor during a first time period and a second time period includes driving the bipolar junction transistor to operate in a hard-saturation region during the first time period, and driving the bipolar junction transistor to operate in a quasi-saturation region during the second time period. The first time period is followed by the second time period. The first time period starts at a first time and ends at a second time. The second time period starts at a third time and ends at a fourth time. The drive current signal is equal to a first current at the first time, a second current at the second time, a third current at the third time, and a fourth current at the fourth time. The second current is larger than the third current in magnitude, and the second time and the third time are the same. For example, the method is implemented according to at least FIG. 4(A), FIG. 4(B), FIG. 5, FIG. 6(A), FIG. 6(B), FIG. 7, FIG. 8(A), FIG. 8(B), and/or FIG. 9.

According to yet another embodiment, a system for driving a bipolar junction transistor for a power converter includes a current generator configured to output a drive current signal to a bipolar junction transistor to adjust a primary current flowing through a primary winding of a power converter. The current generator is further configured to output the drive current signal to turn on the bipolar junction transistor during a first time period and a second time period and to turn off the bipolar junction transistor during a third time period and a fourth time period. Moreover, the current generator is configured to drive the bipolar junction transistor to operate in a hard-saturation region during the first time period. Furthermore, the current generator is configured to drive the bipolar junction transistor to operate in a quasi-saturation region during the second time period. The first time period is followed by the second time period. The second time period is followed by the fourth time period. The first time period is preceded by the third time period. The first time period starts at a first time and ends at a second time. The second time period starts at a third time and ends at a fourth time. The third time period ends at a fifth time, and the fourth time period starts at a sixth time. The drive current signal is equal to a first current at the first time, a second current at the second time, a third current at the third time, a fourth current at the fourth time, a fifth current at the fifth time, and a sixth current at the sixth time. The second current is larger than the third current in magnitude. The fifth current is smaller than the first current in magnitude, and the sixth current is different from the fourth current. For example, the system is implemented according to at least FIG. 4(A), FIG. 4(B), FIG. 5, FIG. 6(A), FIG. 6(B), FIG. 7, FIG. 8(A), FIG. 8(B), and/or FIG. 9.

According to yet another embodiment, a method for driving a bipolar junction transistor for a power converter includes generating a drive current signal, and outputting the drive current signal to a bipolar junction transistor to adjust a primary current flowing through a primary winding of a power converter. The process for outputting the drive current signal to a bipolar junction transistor includes outputting the drive current signal to turn on the bipolar junction transistor during a first time period and a second time period, and outputting the drive current signal to turn off the bipolar junction transistor during a third time period and a fourth time period. The process for outputting the drive current signal to turn on the bipolar junction transistor during a first time period and a second time period includes driving the bipolar junction transistor to operate in a hard-saturation region during the first time period, and driving the bipolar junction transistor to operate in a quasi-saturation region during the second time period. The first time period is followed by the second time period. The second time period is followed by the fourth time period. The first time period is preceded by the third time period. The first time period starts at a first time and ends at a second time. The second time period starts at a third time and ends at a fourth time. The third time period ends at a fifth time, and the fourth time period starts at a sixth time. The drive current signal is equal to a first current at the first time, a second current at the second time, a third current at the third time, a fourth current at the fourth time, a fifth current at the fifth time, and a sixth current at the sixth time. The second current is larger than the third current in magnitude. The fifth current is smaller than the first current in magnitude, and the sixth current is different from the fourth current. For example, the method is implemented according to at least FIG. 4(A), FIG. 4(B), FIG. 5, FIG. 6(A), FIG. 6(B), FIG. 7, FIG. 8(A), FIG. 8(B), and/or FIG. 9.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for driving a bipolar junction transistor for a power converter, the system comprising:
   a current generator configured to output a drive current signal to the bipolar junction transistor to adjust a primary current flowing through a primary winding of the power converter;
   wherein:
      the current generator is further configured to drive the bipolar junction transistor to operate in a hard-saturation region during a first time period and a second time period;
      the first time period is followed by the second time period;
      the first time period starts at a first time and ends at a second time; and
      the second time period starts at a third time and ends at a fourth time;
   wherein:
      the drive current signal is equal to a first current at the first time;
      the drive current signal is equal to a second current at the second time;
      the drive current signal is equal to a third current at the third time; and
      the drive current signal is equal to a fourth current at the fourth time;
   wherein the current generator is further configured to:
      receive a feedback signal associated with the primary current; and
      generate the drive current signal based on at least information associated with the feedback signal during at least the second time period; and
   wherein:

the second current is larger than the third current in magnitude; and the second time and the third time are the same;

wherein the fourth current is larger than the third current in magnitude.

2. The system of claim 1 wherein the feedback signal is selected from a group consisting of a voltage signal associated with the primary current and a current signal associated with the primary current.

3. The system of claim 1 wherein:

the current generator is further configured to output the drive current signal to turn off the bipolar junction transistor during a third time period before the first time period;

the third time period ends at a fifth time;

the drive current signal is equal to a fifth current at the fifth time; and the fifth current is smaller than the first current in magnitude.

4. The system of claim 3 wherein the first time and the fifth time are the same.

5. A method for driving a bipolar junction transistor for a power converter, the method comprising:

generating a drive current signal; and outputting the drive current signal to the bipolar junction transistor to adjust a primary current flowing through a primary winding of the power converter;

wherein:

the process for outputting the drive current signal to the bipolar junction transistor includes driving the bipolar junction transistor to operate in a hard-saturation region during a first time period and a second time period; and the process for driving the bipolar junction transistor to operate in the hard-saturation region during the first time period and the second time period includes:

receiving a feedback signal associated with the primary current; and generating the drive current signal based on at least information associated with the feedback signal during at least the second time period;

wherein:

the first time period is followed by the second time period;

the first time period starts at a first time and ends at a second time;

the second time period starts at a third time and ends at a fourth time;

the drive current signal is equal to a first current at the first time;

the drive current signal is equal to a second current at the second time;

the drive current signal is equal to a third current at the third time; and the drive current signal is equal to a fourth current at the fourth time;

wherein:

the second current is larger than the third current in magnitude; and the second time and the third time are the same;

wherein the fourth current is larger than the third current in magnitude.

6. A system for driving a bipolar junction transistor for a power converter, the system comprising:

a current generator configured to output a drive current signal to the bipolar junction transistor to adjust a primary current flowing through a primary winding of the power converter;

wherein the current generator is further configured to:

output the drive current signal to turn on the bipolar junction transistor during a first time period and a second time period, the first time period being followed by the second time period;

drive the bipolar junction transistor to operate in a hard-saturation region during the first time period; and drive the bipolar junction transistor to operate in a quasi-saturation region during the second time period;

wherein:

the first time period starts at a first time and ends at a second time; and the second time period starts at a third time and ends at a fourth time;

wherein:

the drive current signal is equal to a first current at the first time;

the drive current signal is equal to a second current at the second time;

the drive current signal is equal to a third current at the third time; and the drive current signal is equal to a fourth current at the fourth time;

wherein the current generator is further configured to:

receive a feedback signal associated with the primary current; and generate the drive current signal based on at least information associated with the feedback signal during at least the first time period;

wherein:

the second current is larger than the third current in magnitude; and the second time and the third time are the same;

wherein the second current is larger than the first current in magnitude;

wherein:

the current generator is further configured to output the drive current signal to turn off the bipolar junction transistor during a third time period after the second time period;

the third time period starts at a fifth time;

the drive current signal is equal to a fifth current at the fifth time; and the fifth current is different from the fourth current;

wherein:

the fourth current is configured to flow into the bipolar junction transistor; and the fifth current is configured to flow out of the bipolar junction transistor.

7. The system of claim 6 wherein the feedback signal is selected from a group consisting of a voltage signal associated with the primary current and a current signal associated with the primary current.

8. The system of claim 6 wherein the fourth time and the fifth time are the same.

9. A method for driving a bipolar junction transistor for a power converter, the method comprising:

generating a drive current signal; and outputting the drive current signal to the bipolar junction transistor to adjust a primary current flowing through a primary winding of the power converter;

wherein:
the process for outputting the drive current signal to the bipolar junction transistor includes outputting the drive current signal to turn on the bipolar junction transistor during a first time period and a second time period;
the process for outputting the drive current signal to turn on the bipolar junction transistor during the first time period and the second time period includes:
driving the bipolar junction transistor to operate in a hard-saturation region during the first time period; and
driving the bipolar junction transistor to operate in a quasi-saturation region during the second time period;
wherein:
the first time period is followed by the second time period;
the first time period starts at a first time and ends at a second time;
the second time period starts at a third time and ends at a fourth time;
the drive current signal is equal to a first current at the first time;
the drive current signal is equal to a second current at the second time;
the drive current signal is equal to a third current at the third time; and
the drive current signal is equal to a fourth current at the fourth time;
wherein:
the second current is larger than the third current in magnitude; and
the second time and the third time are the same;
wherein the second current is larger than the first current in magnitude;
wherein:
the outputting the drive current signal to the bipolar junction transistor to adjust a primary current flowing through a primary winding of the power converter includes outputting the drive current signal to turn off the bipolar junction transistor during a third time period after the second time period;
the third time period starts at a fifth time;
the drive current signal is equal to a fifth current at the fifth time; and
the fifth current is different from the fourth current;
wherein:
the fourth current is configured to flow into the bipolar junction transistor; and
the fifth current is configured to flow out of the bipolar junction transistor.

10. A system for driving a bipolar junction transistor for a power converter, the system comprising:
a current generator configured to output a drive current signal to the bipolar junction transistor to adjust a primary current flowing through a primary winding of the power converter;
wherein the current generator is further configured to:
output the drive current signal to turn on the bipolar junction transistor during a first time period and a second time period and to turn off the bipolar junction transistor during a third time period and a fourth time period;
drive the bipolar junction transistor to operate in a hard-saturation region during the first time period; and
drive the bipolar junction transistor to operate in a quasi-saturation region during the second time period;
wherein:
the first time period is followed by the second time period;
the second time period is followed by the fourth time period; and
the first time period is preceded by the third time period;
wherein:
the first time period starts at a first time and ends at a second time;
the second time period starts at a third time and ends at a fourth time;
the third time period ends at a fifth time; and
the fourth time period starts at a sixth time;
wherein:
the drive current signal is equal to a first current at the first time;
the drive current signal is equal to a second current at the second time;
the drive current signal is equal to a third current at the third time;
the drive current signal is equal to a fourth current at the fourth time;
the drive current signal is equal to a fifth current at the fifth time; and
the drive current signal is equal to a sixth current at the sixth time;
wherein:
the second current is larger than the third current in magnitude;
the fifth current is smaller than the first current in magnitude; and
the sixth current is different from the fourth current.

11. The system of claim 10 wherein:
the fourth current is configured to flow into the bipolar junction transistor; and
the sixth current is configured to flow out of the bipolar junction transistor.

12. The system of claim 10 wherein the fifth time and the first time are the same.

13. The system of claim 12 wherein the sixth time and the fourth time are the same.

14. The system of claim 10 wherein the second time and the third time are different.

15. A method for driving a bipolar junction transistor for a power converter, the method comprising:
generating a drive current signal; and
outputting the drive current signal to the bipolar junction transistor to adjust a primary current flowing through a primary winding of the power converter;
wherein the process for outputting the drive current signal to the bipolar junction transistor includes:
outputting the drive current signal to turn on the bipolar junction transistor during a first time period and a second time period; and
outputting the drive current signal to turn off the bipolar junction transistor during a third time period and a fourth time period;
wherein the process for outputting the drive current signal to turn on the bipolar junction transistor during the first time period and the second time period includes:
driving the bipolar junction transistor to operate in a hard-saturation region during the first time period; and driving the bipolar junction transistor to operate in a quasi-saturation region during the second time period;
wherein:
the first time period is followed by the second time period;
the second time period is followed by the fourth time period; and
the first time period is preceded by the third time period;
wherein:
the first time period starts at a first time and ends at a second time;
the second time period starts at a third time and ends at a fourth time;
the third time period ends at a fifth time; and
the fourth time period starts at a sixth time;
wherein:
the drive current signal is equal to a first current at the first time;
the drive current signal is equal to a second current at the second time;
the drive current signal is equal to a third current at the third time;
the drive current signal is equal to a fourth current at the fourth time;
the drive current signal is equal to a fifth current at the fifth time; and
the drive current signal is equal to a sixth current at the sixth time;
wherein:
the second current is larger than the third current in magnitude;
the fifth current is smaller than the first current in magnitude; and
the sixth current is different from the fourth current.

16. A system for driving a bipolar junction transistor for a power converter, the system comprising:
a current generator configured to output a drive current signal to a bipolar junction transistor to adjust an output current flowing through a primary winding of a power converter;
wherein the current generator is further configured to:
output the drive current signal to turn on the bipolar junction transistor during a first time period, a second time period, and a third time period, the second time period separating the first time period from the third time period;
drive the bipolar junction transistor to operate in a first mode during the first time period and the second time period; and
drive the bipolar junction transistor to operate in a second mode during the third time period;
wherein:
the first time period starts at a first time and ends at a second time;
the second time period starts at a third time and ends at a fourth time; and
the third time period starts at a fifth time and ends at a sixth time;
wherein:
the drive current signal is equal to a first current at the first time;
the drive current signal is equal to a second current at the second time;
the drive current signal is equal to a third current at the third time;
the drive current signal is equal to a fourth current at the fourth time;
the drive current signal is equal to a fifth current at the fifth time; and
the drive current signal is equal to a sixth current at the sixth time;
wherein:
the second current is larger than the third current in magnitude; and
the fourth current is larger than the fifth current in magnitude.

17. The system of claim 16 wherein the current generator is further configured to:
receive a feedback signal associated with the output current; and
generate the drive current signal based on at least information associated with the feedback signal during at least the second time period.

18. The system of claim 17 wherein the current generator is further configured to generate the drive current signal based on at least information associated with the feedback signal during the first time period and the second time period.

19. The system of claim 16 wherein:
the current generator is further configured to output the drive current signal to turn off the bipolar junction transistor during a fourth time period;
the fourth time period ends at a seventh time;
the drive current signal is equal to a seventh current at the seventh time; and
the seventh current is smaller than the first current in magnitude.

20. The system of claim 19 wherein the seventh time is the same as the first time.

21. The system of claim 16 wherein:
the current generator is further configured to output the drive current signal to turn off the bipolar junction transistor during a fourth time period;
the fourth time period starts at a seventh time;
the drive current signal is equal to a seventh current at the seventh time; and
the seventh current is different from the sixth current.

22. The system of claim 21 wherein the seventh time is the same as the sixth time.

23. A method for driving a bipolar junction transistor for a power converter, the method comprising:
generating a drive current signal; and
outputting the drive current signal to a bipolar junction transistor to adjust an output current flowing through a primary winding of a power converter;
wherein the outputting the drive current signal to the bipolar junction transistor includes:
outputting the drive current signal to turn on the bipolar junction transistor during a first time period, a second time period, and a third time period, the second time period separating the first time period from the third time period;
driving the bipolar junction transistor to operate in a first mode during the first time period and the second time period; and
driving the bipolar junction transistor to operate in a second mode during the third time period;
wherein:
the first time period starts at a first time and ends at a second time;
the second time period starts at a third time and ends at a fourth time; and the third time period starts at a fifth time and ends at a sixth time;

wherein:

the drive current signal is equal to a first current at the first time;

the drive current signal is equal to a second current at the second time;

the drive current signal is equal to a third current at the third time;

the drive current signal is equal to a fourth current at the fourth time;

the drive current signal is equal to a fifth current at the fifth time; and the drive current signal is equal to a sixth current at the sixth time;

wherein:

the second current is larger than the third current in magnitude; and the fourth current is larger than the fifth current in magnitude.

\* \* \* \* \*